(12) United States Patent
Xiang et al.

(10) Patent No.: US 6,562,718 B1
(45) Date of Patent: May 13, 2003

(54) PROCESS FOR FORMING FULLY SILICIDED GATES

(75) Inventors: Qi Xiang, San Jose, CA (US); Ercan Adem, Sunnyvale, CA (US); Jacques J. Bertrand, Capitola, CA (US); Paul R. Besser, Austin, TX (US); Matthew S. Buynoski, Palo Alto, CA (US); John C. Foster, Mountain View, CA (US); Paul L. King, Mountain View, CA (US); George J. Kluth, Sunnyvale, CA (US); Minh V. Ngo, Fremont, CA (US); Eric N. Paton, Morgan Hill, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/729,700

(22) Filed: Dec. 6, 2000

(51) Int. Cl.[7] ............................................... H01L 21/44
(52) U.S. Cl. ........................................ 438/682; 257/388
(58) Field of Search ................................ 438/682, 224, 438/592, 197, 299, 237; 257/412, 385, 388; 220/203.5

(56) References Cited

U.S. PATENT DOCUMENTS

| 4,577,396 | A | * | 3/1986 | Yamamoto et al. ...... 220/203.5 |
| 4,780,429 | A | * | 10/1988 | Roche et al. ................ 438/237 |
| 5,168,332 | A | * | 12/1992 | Kunishima et al. ......... 257/385 |
| 5,907,784 | A | * | 5/1999 | Larson ........................ 438/592 |
| 5,953,612 | A | * | 9/1999 | Lin et al. ..................... 438/299 |
| 6,037,263 | A | * | 3/2000 | Chang ......................... 438/712 |
| 6,204,103 | B1 | * | 3/2001 | Bai et al. ..................... 438/224 |
| 6,306,698 | B1 | * | 10/2001 | Wieczorek et al. ......... 438/197 |
| 2001/0038136 | A1 | * | 11/2001 | Abiko .......................... 257/412 |

* cited by examiner

Primary Examiner—William David Coleman

(57) ABSTRACT

A method of forming a fully silicidized gate of a semiconductor device includes forming silicide in active regions and a portion of a gate. A shield layer is blanket deposited over the device. The top surface of the gate electrode is then exposed. A refractory metal layer is deposited and annealing is performed to cause the metal to react with the gate and fully silicidize the gate, with the shield layer protecting the active regions of the device from further silicidization to thereby prevent spiking and current leakage in the active regions.

18 Claims, 3 Drawing Sheets

PROCESS FOR FORMING FULLY SILICIDED GATES

FIELD OF THE INVENTION

The present invention relates to semiconductor fabrication and in particular to self-aligned silicide technology.

BACKGROUND OF THE INVENTION

Silicide technology is improving the performance characteristics of semiconductor devices, and is becoming an essential component of semiconductor device fabrication. As gate electrode lengths are scaled down, the source/drain junctions and polycrystalline line width must also be scaled down. However, scaling down the source/drain junctions and polycrystalline line width increases parasitic, sheet, and contact resistance in the source/drain diffusion layers and gate electrode diffusion layer. Silicidizing active regions of substrates reduces parasitic, sheet, and contact resistance in the source/drain diffusion layers and gate electrode diffusion layer. Silicide technology comprises forming silicide layers on the source/drain regions and/or on the gate electrode in a self-aligned manner.

Silicides are typically formed by reacting a metal with crystallized silicon (Si) within a specified temperature range for a specific period of time. Silicide layers may be self-aligned by different techniques. For example, selectively depositing the metal on the top of the gate electrode and on the source/drain regions of a semiconductor device prior to an annealing process causes only the Si of the source/drain regions and the top of the gate electrode to form silicide upon annealing. Alternatively, sidewall spacers on the sides of the gate electrode comprising of a material that does not react with the metal layer allow a blanket layer of metal to be deposited over a semiconductor device while restricting silicide formation to a portion of the exposed source/drain regions during an annealing process. During the annealing process, the semiconductor device is heated to a reaction temperature, and held at the reaction temperature for a period of time, causing the metal layer to react with the crystallized Si that the metal contacts, thus forming a silicide layer interfacing with the remaining crystallized Si substrate of the source/drain regions and/or the gate electrode. Multiple annealing steps may be employed. Various metals react with Si to form a silicide including but not limited to Co, Ni, Pt, Ti, W, etc.

The thickness of the silicide layer is an important parameter because a thin silicide layer is more resistive than a thicker silicide layer of the same material; thus a thicker silicide layer increases semiconductor device speed. Conventional silicide technology for reducing parasitic series resistance has proven problematic, particularly as design rules plunge into the deep-submicron range. For example, the formation of a thick suicide layer may cause a high junction leakage current and low reliability, particularly when forming ultra-shallow junctions. The formation of a thick silicide layer consumes silicon from the underlying semiconductor substrate such that the thick silicide layer approaches and even shorts the ultra-shallow junction, thereby generating a high junction leakage current.

Recently, attention has turned towards using nickel to form NiSi utilizing silicide technology. Using NiSi is advantageous over using $TiSi_2$ and $CoSi_2$ because many limitations associated with $TiSi_2$ and $CoSi_2$ are avoided. When forming NiSi, a low resistivity phase is the first phase to form, and does so at a relatively low temperature. Additionally, nickel (Ni), like Co, diffuses through the film into Si, unlike Ti where the Si diffuses into the metal layer. Diffusion of Ni, and Co, through the film into Si prevents bridging between the silicide layer on the gate electrode and the silicide layer over the source/drain regions. The reaction that forms NiSi requires less Si than when $TiSi_2$ and $CoSi_2$ are formed. Nickel silicide exhibits almost no line-width dependence of sheet resistance. Nickel silicide also exhibits low film stress, i.e., causes less wafer distortion.

In addition to the formation of silicide on the active regions, silicide is also normally formed on the polysilicon gate electrode's upper surface. It is desirable to lower the resistance of the gate electrode to increase the speed of the device. The greater the amount of silicon converted into silicide in the gate electrode, the lower the resistance will be in the gate electrode. However, formation of silicide on the gate electrode simultaneously with the source/drain regions leads to the risk of spiking in the source/drain regions, if the complete silicidation of the gate electrode is attempted. This is due to the strong likelihood that exposure of the metal and silicon to rapid thermal annealing conditions sufficient to completely silicidize a gate electrode will also cause the silicide to spike and reach the bottom of a junction, undesirably causing current leakage. There is a need for a method of forming a substantially fully silicidized gate electrode while avoiding the spiking of a source/drain region in a semiconductor device.

SUMMARY OF THE INVENTION

These and other needs are met by embodiments of the present invention of forming a fully silicidized gate on a substrate having active regions, the method comprising the steps of forming silicide on the active regions of the substrate; and fully silicidizing the gate..

Another aspect of the present invention is a method of forming a fully silicidized gate on a substrate having active regions, the method comprising the steps of: forming silicide on the active regions; providing a shielding layer over the substrate leaving the gate exposed; depositing a metal on the gate; and annealing to cause the metal to react with the gate thereby substantially fully silicidizing the gate.

An advantage of the present invention is a semiconductor device having active regions and, more particularly, a gate region comprising low resistivity contacts and exhibiting reduced parasitic series resistance, especially in the gate region, and exhibiting reduced leakage current.

Additional advantages of the present invention will become readily apparent to those skilled in the art from the following detailed description, wherein embodiments of the present invention are described simply by way of illustrating the best mode contemplated for carrying out the present invention. As will be realized, the present invention is capable of other and different embodiments, and its several details are capable of modifications in various obvious respects, all without departing from the invention. Accordingly, the drawing and description are to be regarded as illustrative in nature, and not as restrictive.

DETAILED DESCRIPTION OF THE INVENTION

Figure 1:
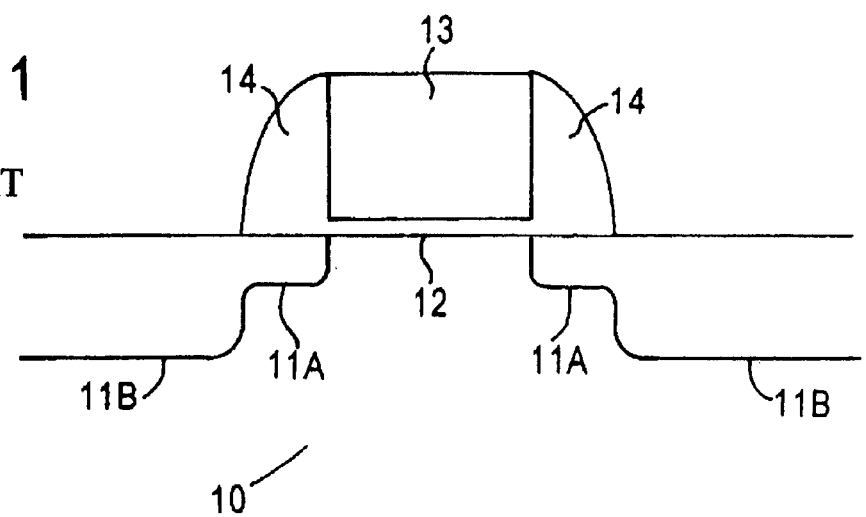
FIGS. 1–9 schematically illustrate sequential phases of forming a fully silicided gate in accordance with an embodiment of the present invention.

The present invention addresses and solves problems attendant upon conventional silicide technology for parasitic series resistances. Conventional silicide methodology comprises forming a layer of silicide on the source/drain diffusion layers and on the silicon gate electrode, to prevent an increase in parasitic series resistance due to scaling down of the source/drain junction depth and silicon line width. Attempts to fully silicidize the gate in a conventional process would normally lead to a formation of a silicide layer on the source/drain regions that approaches and frequently overlaps the shallow junction causing an increase in junction leakage current.

The present invention addresses and solves such problems by providing a silicidized source/drain region and a substantially fully silicidized gate electrode for lowering parasitic series resistances. In accordance with various embodiments of the present invention, the metal suicide layer of the composite is formed with significantly reduced consumption of silicon from the underlying source/drain regions as compared to the gate electrode, thereby significantly lessening the junction leakage and increasing reliability of ultra-shallow junctions. The present invention enjoys utility in manufacturing any of various types of semiconductor devices, particularly advanced deep-submicron CMOS devices, such as 0.1 microns with ultra-shallow junctions, e.g., less than about 800 Å. The present invention enables the formation of low resistivity contacts having a thickness sufficient to reduce parasitic series resistance, e.g., above about 500 Å to about 2000 Å, while significantly improving the reliability of ultra-shallow junctions.

In accordance with embodiments of the present invention, a metal layer is selectively deposited on the source/drain regions and the gate electrode. Thus, the metal layer is self-aligned with the source/drain regions and the gate electrode. By annealing the substrate, the metal reacts with the underlying silicon to form a metal suicide layer on the exposed portions of the source/drain regions and on the upper surface of the gate electrode. Next, a shielding layer is applied to the substrate over the active regions, leaving the gate electrode exposed. This shielding layer serves as a barrier, thereby keeping subsequently deposited metal from reacting with the source/drain regions. Next, a layer of metal is again deposited on the substrate, thereby coming into contact with the shielding layer and the exposed gate electrode. Heating again allows the metal to react with the gate electrode, thereby fully silicidizing the gate electrode. However, further silicidization of the source/drain regions is prevented by the shielding layer. Excess metal and the shielding layer are removed from the substrate producing silicidized source/drain regions and a fully silicidized gate electrode. This reduces gate resistance while at the same time avoiding spiking of the source/drain regions.

Embodiments of the present invention comprise depositing the metal layers to equal a combined thickness that is proportional to the height of the electrode gate. The first deposited metal layer will be of a certain thickness based on the depth of the ultra-shallow source/drain junctions. The second deposited metal layer may be of a different thickness required to fully silicidize the gate electrode. For example, using nickel as the deposited metal requires a thickness ratio of nickel to the height of the gate electrode in the range of about 1:3 to about 1:4. Therefore, if the gate electrode has a height of 1000 Å, the combined thickness of the first and second deposited nickel layer should be in the range of 250 Å to 350 Å.

In certain embodiments of the invention, the rapid thermal annealing processes conducted to react the metal with the silicon are performed at a temperature of about 500° C. to about 600° C. when using nickel. Additionally, the rapid annealing thermal processes lasts between about 30 to about 60 seconds.

In accordance with the present invention, the substrate comprises crystalline silicon, e.g., monocrystalline silicon. The substrate can either be a P-type substrate, or an N-type substrate, with the source/drain regions having a conductivity type opposite to that of the substrate.

Sequential phases of the method in accordance with an embodiment of the present invention are schematically illustrated in FIGS. 1–9, wherein similar reference numerals denote similar features. Adverting to FIG. 1, a conventional transistor structure, formed in a conventional manner, comprises a substrate 10 doped with either an N-type impurity or P-type impurity, and source/drain regions 11 comprising a shallow extension region 11A and a heavily doped (HD) region 11B doped with either a P-type impurity or an N-type impurity, respectively. The source/drain regions 11 are formed in a conventional manner as, for example, by forming gate electrode layer 13 on semiconductor substrate 10 with gate dielectric layer 12, e.g., a gate oxide such as silicon dioxide, therebetween. Using the gate electrode 13 as a mask, shallow extension regions 11A are formed. Dielectric sidewall spacers 14 are then formed on the side surfaces of the gate electrode 13. Dielectric sidewall spacers 14 can comprise any suitable dielectric material, such as silicon dioxide, silicon nitride, or a composite of silicon dioxide and silicon nitride. Ion implantation is then conducted, using the gate electrode 13 and sidewall spacers 14 as a mask to form HD regions 11B.

Figure 2:
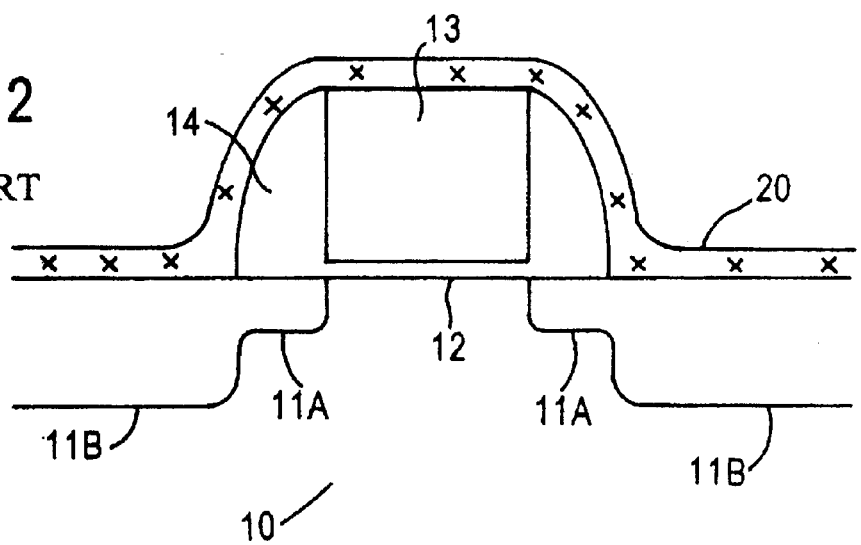

Adverting to FIG. 2, a metal layer 20, such as nickel, is blanket deposited over the exposed portions of the source/drain regions 11, i.e., on the HD regions, and on the upper surface of the gate electrode 13. The formation of metal layer 20 can be effected in any conventional manner, such as chemical vapor deposition (CVD) or sputtering. An exemplary thickness of metal layer 20 is between about 80 Å and about 150 Å. This will produce silicide in the substrate 10 to a depth of about 200 Å to about 400 Å, as nickel thickness to silicide depth is about 1:3 or 1:4.

Figure 3:
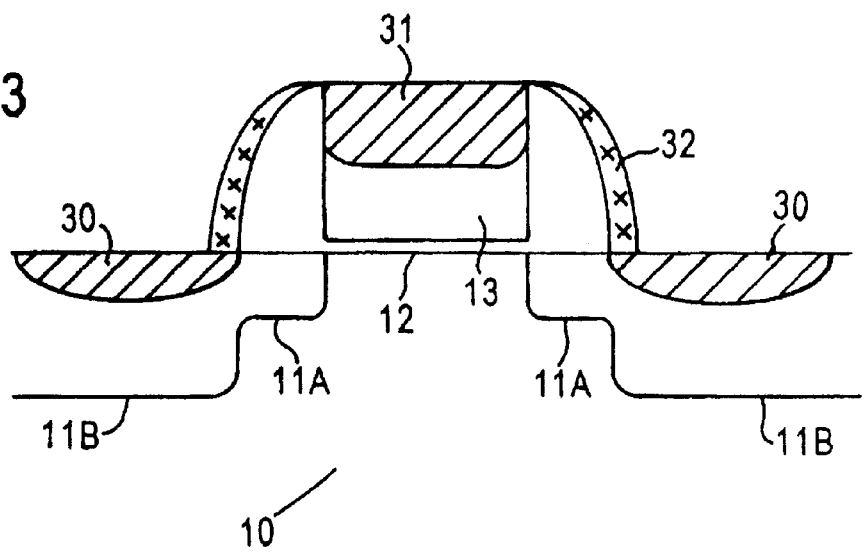

Adverting to FIG. 3, rapid thermal annealing (RTA) is then conducted. The RTA may take place at a temperature of about 350° C. to about 700° C. for about 10 to about 90 seconds when nickel is employed as the metal. Other RTA parameters may be used depending on the metal used and the silicide qualities desired. Upon annealing, a nickel silicide layer 30, 31 forms in the source/drain regions 11 and the gate electrode 13. Advantageously, the thickness of the silicide layers 30, 31 in the source/drain region can be tailored or optimized by controlling the thickness of the deposited nickel layer 20.

Figure 4:
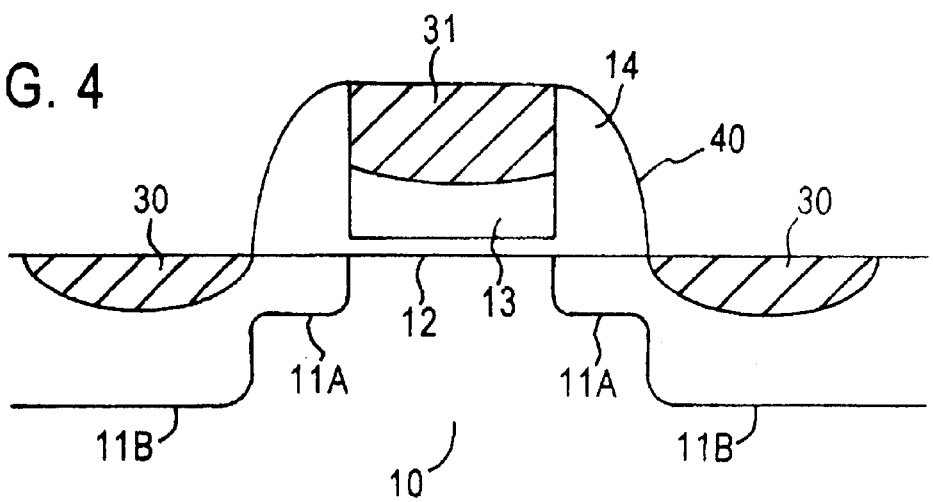

Adverting to FIG. 4, any unreacted metal 32 is removed from the substrate 10, leaving a clean surface 40. The unreacted metal may be removed by a wet chemical etch, such as with sulfuric peroxide mixture $H_2SO_4$:$H_2O_3$ (3:1) with deonized $H_2O$ at a temperature of 100° C. The removal rate of nickel at the 3:1 ratio is about 10,000 Å/minute. This exemplary wet chemical etch exhibits high selectivity for the unreacted nickel 32 relative to the nickel silicide layers 30, 31.

Figure 5:
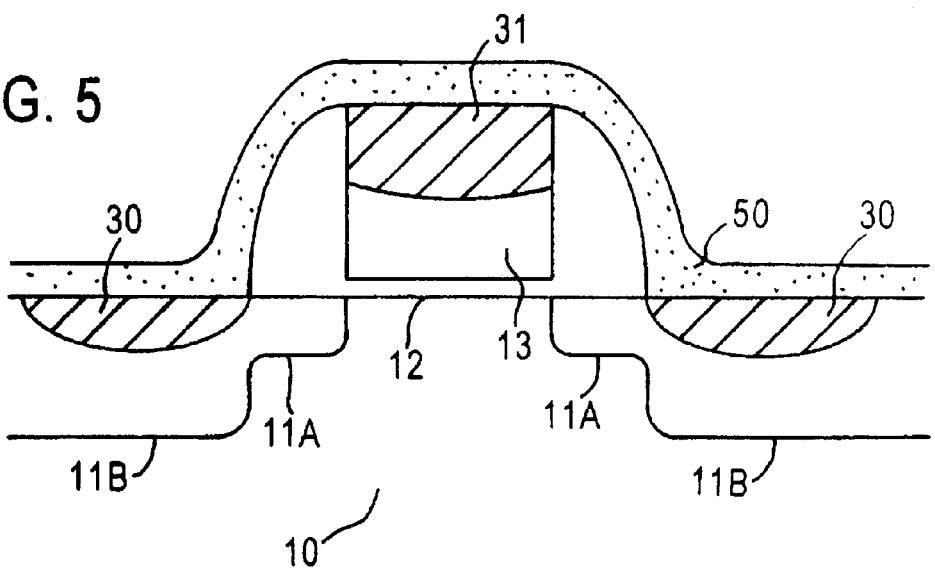

Adverting to FIG. 5, a shielding layer 50 is deposited over the semiconductor device. An exemplary material for the shielding layer is silicon oxide, or some other material that will not react with the subsequently deposited metal, thereby protecting the silicidized source/drain regions 30 when a subsequent nickel layer is deposited over the substrate 10. The formation of the shielding layer 50 may be by chemical vapor deposition, for example.

Figure 6:
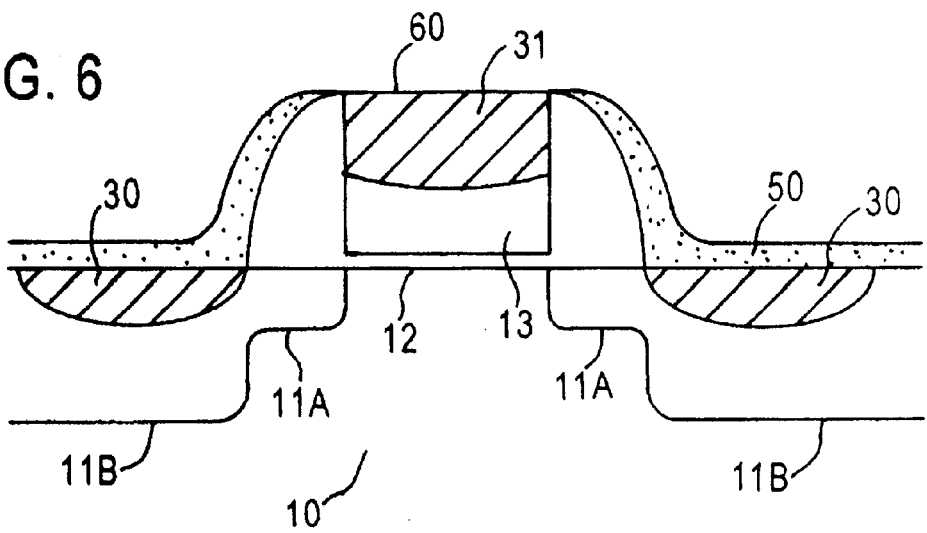

Adverting to FIG. 6, the shielding layer 50 is removed from the surface of the gate electrode 13, thereby exposing the gate electrode and shielding the silicided source/drain regions 30 of the substrate 10. The shielding layer 50 may be exposed by a polishing method, for example, such as chemical mechanical polishing (CMP). The CMP process should be performed until all of the oxide over the top surface 60 of the gate electrode 13 is removed. The surface 60 is then cleaned by ammonium methyl fluorine (AMCF), for example, and scrubbed using $H_2O$, for example.

Figure 7:
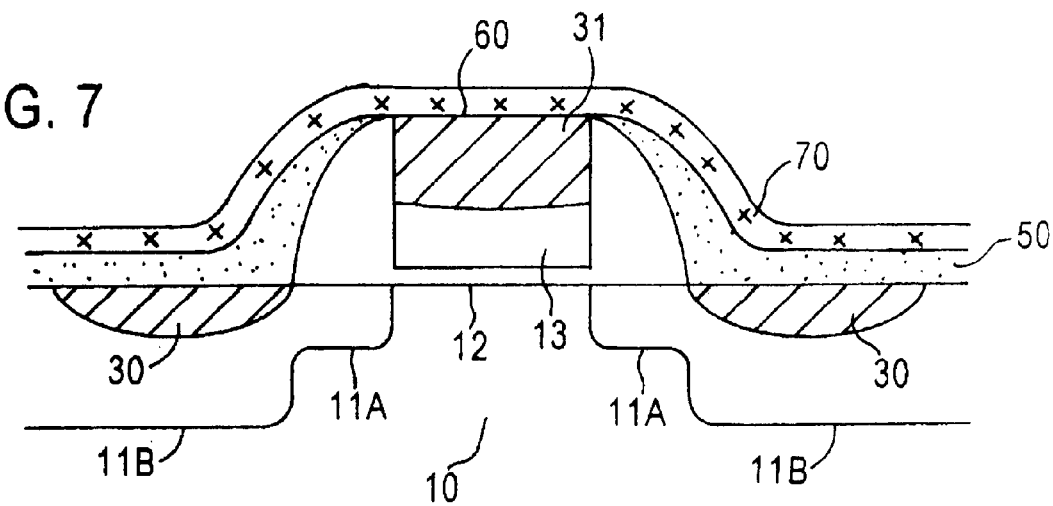

Adverting to FIG. 7, a metal layer 70, such as nickel, is blanket deposited over the semiconductor device including the exposed surface 60 of the gate electrode 13. The thickness of the deposited metal layer 70 is at least of a specific thickness that, once annealed, will react with the gate electrode, to fully silicidize the gate. Hence, the thickness of the metal layer 70 needs to be great enough to assure that the gate is fully silicidized. As the ratio of nickel to silicide is about 1:3 or 1:4, for a 1000 Å gate, a 250 Å to about 400 Å layer of nickel is sufficient to fully silicidize the gate electrode 13 in this examplary embodiment. This thickness may be reduced somewhat, depending on the depth of the silicidation in the gate electrode 13 (i.e., the depth of silicide layer 31) created in the first silicidation process. Forming the metal layer 70 to a greater thickness, however, ensures a sufficient source of metal for silicidizing the gate electrode 13.

Figure 8:
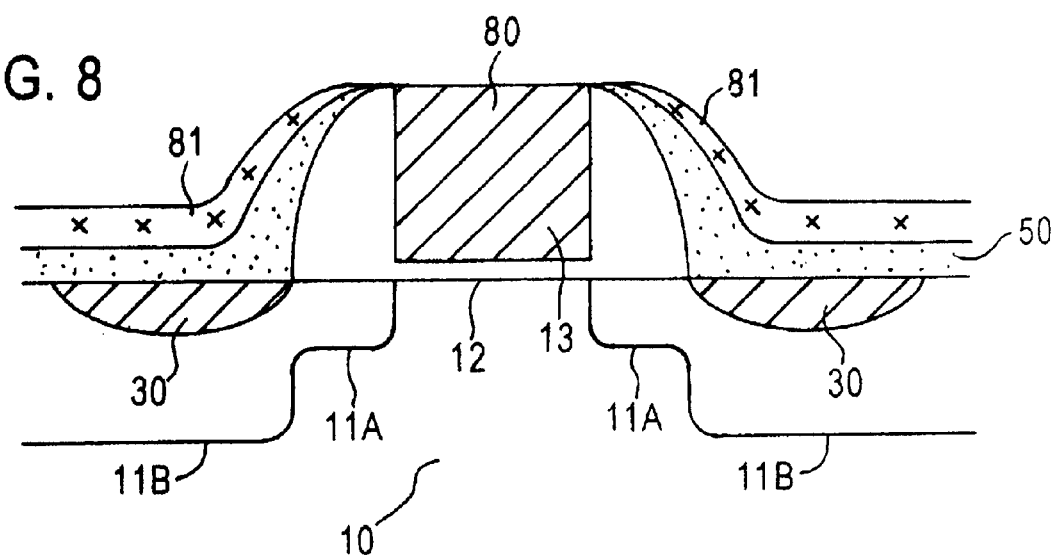

Adverting to FIG. 8, a RTA process applied to the substrate causes the metal 70 to react with the gate electrode 13. The metal 70 diffuses into the gate electrode 13 to fully silicidize the gate electrode 13. Although nickel has been described as a preferred metal for the present invention, other metals that form silicides and are the predominant diffusion species may be used, such as Pd, Cr, Co, etc. Annealing process parameters and thickness of the deposited metal change in dependence on the metal used.

Figure 9:
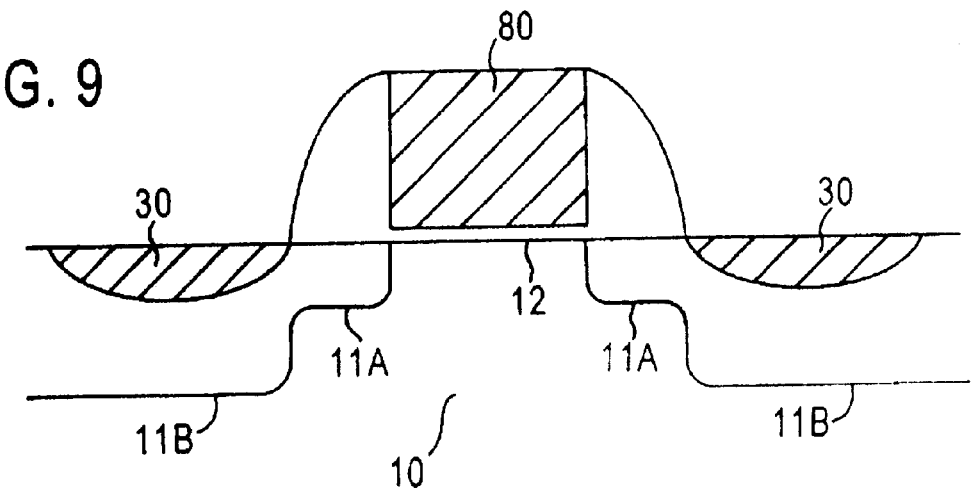

Adverting to FIG. 9, the unreacted metal layer 81 and the shielding layer 50 are removed, thereby providing a fully silicidized gate electrode 80 and silicided source/drain regions 30. Etching may be performed, for example, in a two-step etching process. A wet chemical etch that is highly selective for unreacted metal relative to the silicide, such as previously described for nickel, is employed to remove the unreacted metal 81. The shield layer 50 may then be removed using conventional etching techniques suitable for removing that material selectively relative to the oxide, for example, phosphoric acid etching may be employed. Alternatively, a single etch that etches both the unreacted metal 81 and the shield layer 50 selectively relative to the silicide 80, 30 may be employed.

The present invention can be readily integrated in the current methodology with an attendant advantageous significant reduction in parasitic, sheet and contact resistance, while not increasing junction leakage current and improving the reliability of ultra-shallow source/drain regions. Accordingly, the present invention achieves the technological advantage of enabling formation of reliable ultra-shallow source/drain junctions to meet the increasing demands for high density and miniaturization, as in manufacturing deep-submicron CMOS devices.

In the previous description, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of forming a fully silicidized gate on a substrate having active regions, the method comprising the steps of:

fully silicidizing the gate;

depositing a first layer of metal over the active regions and the gate;

annealing to cause the metal to react with the active regions forming silicide in the active regions and a portion of the gate; and depositing a shielding layer over the active regions after forming silicide on the active regions, the shielding material preventing subsequently deposited metal from reacting with the active regions.

2. The method of claim 1, further comprising exposing a top surface of the gate after the shielding layer is deposited.

3. The method of claim 1, wherein the step of fully silicidizing the gate comprises:

depositing a second layer of metal over the gate of a sufficient thickness to substantially fully silicidize the gate upon annealing; and annealing to cause the metal to react with the gate thereby fully silicidizing the gate.

4. The metal of claim 1, wherein the shielding material is silicon oxide.

5. The method of claim 3, wherein the ratio of a combined thickness of the first and second metal layers relative to a height of the gate is sufficient to fully silicidize the gate upon annealing.

6. The method of claim 2, wherein the step of exposing includes chemical mechanical polishing away the shielding material on the top surface of the gate.

7. The method of claim 3, wherein the metal in the first layer and the metal in the second layer are the same metal.

8. The method of claim 3, wherein the metal is a silicidizing metal that diffuses into silicon.

9. The method of claim 3, wherein the metal is one of Ni, Co, Pd, and Cr.

10. The method of claim 4, wherein the height of the gate is approximately 1000 to approximately 2000 Angstroms.

11. The method of claim 4, wherein the height of the gate is approximately 1000 to approximately 2000 Angstroms.

12. The method of claim 5, wherein the ratio is between approximately 1:3 and approximately 1:4.

13. The method of claim 5, wherein the ratio is between approximately 1:3 and approximately 1:4.

14. A method of forming a fully silicidized gate on a substrate having active regions, the method comprising the steps of:

forming silicide on at least the active regions;

providing a shielding layer over the substrate leaving at least a portion of the top surface of the gate exposed, the shielding layer material preventing subsequently deposited metal from reacting with the active regions;

depositing a metal on the gate; and annealing to cause the metal to react with the gate to substantially fully silicidize the gate.

15. The method of claim 14, wherein the step of forming silicide on the active regions comprises:

depositing a first layer of metal over the active regions and the gate;

annealing to cause the metal to react with the active regions forming silicide in the active regions and a portion of the gate.

16. The method of claim 14, wherein the step of providing a shielding layer over the substrate leaving at least a portion of the top surface of the gate exposed includes chemical mechanical polishing away the shielding material on the top surface of the gate.

17. The method of claim 14, wherein the first layer of metal and the deposited metal on the gate are the same metal said metal being a silicidizing metal that diffuses into silicon.

18. The method of claim 14, wherein the ratio of a combined thickness of the first layer of metal and the deposited metal on the gate relative to a height of the gate is sufficient to fully silicidize the gate upon annealing.

* * * * *